(12) United States Patent
Jung

(10) Patent No.: US 7,199,053 B2
(45) Date of Patent: Apr. 3, 2007

(54) METHOD FOR DETECTING END-POINT OF CHEMICAL MECHANICAL POLISHING PROCESS

(75) Inventor: Jong Goo Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 105 days.

(21) Appl. No.: 10/876,686

(22) Filed: Jun. 28, 2004

(65) Prior Publication Data

US 2005/0142878 A1    Jun. 30, 2005

(30) Foreign Application Priority Data

Dec. 24, 2003   (KR) .................... 10-2003-0096266

(51) Int. Cl.
*H01L 21/461* (2006.01)
(52) U.S. Cl. .............. 438/689; 438/701; 438/693; 216/66; 216/85; 216/59; 216/60; 216/89; 216/84
(58) Field of Classification Search ............... 438/9, 438/692; 216/37, 39
See application file for complete search history.

(56) References Cited

U.S. PATENT DOCUMENTS 6,045,605 A * 4/2000 Doi et al. .................. 106/3
6,126,848 A * 10/2000 Li et al. .................... 216/85
6,613,683 B2 * 9/2003 Hwangbo et al. .......... 438/706

OTHER PUBLICATIONS

S.Wolf and R.N.Tauber, Silicon Processing for the VLSI Era, vol. 1, (1986), Lattice Press, pp. 191-195, 184, 546.*
S.Wolf, Silicon Processing for the VLSI Era, vol. 4, (2002), Lattice Press, pp. 110, 313, 325, 337, 369, 371, 459, 460.*

* cited by examiner

*Primary Examiner*—Nadine Norton
*Assistant Examiner*—Maki Angadi
(74) *Attorney, Agent, or Firm*—Heller Ehrman

(57) ABSTRACT

Disclosed is a method for detecting an end-point of a CMP process of a semiconductor device. More specifically, when all polishing processes are performed using a nitride film as a polishing barrier film, a buffer layer including nitrogen is formed on the nitride film and a polishing process is performed. Then, the concentration of NO from ammonia gas generated from the buffer layer is detected so that the nitride film may be polished to a desired target without damage of the nitride film. As a result, an end-point can be set.

16 Claims, 6 Drawing Sheets

METHOD FOR DETECTING END-POINT OF CHEMICAL MECHANICAL POLISHING PROCESS

BACKGROUND OF THE INVENTION

1. Field of the Invention

The present invention generally relates to a method for detecting an end-point of a chemical mechanical polishing (hereinafter, referred to as "CMP") process of a semiconductor device, and more specifically, to a method for detecting an end-point of a CMP process of a semiconductor device wherein when all polishing processes are performed using a nitride film as a polishing barrier film, a buffer layer including nitrogen is formed on the nitride film and a polishing process is performed so that the nitride film may be polished to a desired target without damage of the nitride film.

2. Description of the Prior Art

In general, for fineness, high capacity and high integration of a semiconductor device, a method for forming landing plug contact (hereinafter, referred to as "LPC") is required so that multi-layered lines may be formed to connect each device electrically.

That is, when a transistor, a bit line and a capacitor are formed in a semiconductor device, a gate is formed on a semiconductor substrate, an insulating film is formed on the whole surface of the resulting structure. Then, the insulating film is planarized by a polishing process, and then a LPC mask (M/K) process and an etching process are performed.

Here, in the polishing process for planarizing the insulating film, the insulating film is completely removed until the upper portion of the gate electrode is exposed in order to prevent generation of step difference between cell and peri regions. Then, an insulating film is re-deposited on the resulting structure and a subsequent process is performed.

However, in the conventional polishing process, in order to completely remove the insulating film, the insulating film is polished for a predetermined time, and its thickness is measured to find that the insulating film is polished to a desired target. Otherwise, whether the hard mask nitride film of the gate electrode is exposed is required to be observed through a CD SEM. When a desired critical dimension (hereinafter, referred to as "CD") of the gate hard mask is not secured by the polishing process, a polishing process is repeated or run is required to be scrapped. As a result, the process time is delayed and yield is degraded.

In order to solve the above-described problems, a method for detecting an end-point of an interlayer insulating film on real-time in a polishing process using an optical method or a motor current method has been currently developed. Of the above-described methods, a method for setting an end-point by measuring ammonia gas generated from when a nitride film is polished has been widely used because the method is rapid and precise.

In the above-described method, when films including nitrogen such as SiN or TiN are polished, ammonia ($NH_3$) gas generated from a slurry is collected in an End Point Detector (EPD) as a gas state, thereby setting an end-point.

According to the principle, if the ammonia gas is converted into NO gas by heat action and enzyme action, NO gas is combined with ozone ($O_3$) as shown in the following equation 1 to form $NO_2$ and excited $NO_2^*$. When the optical chemical reaction generates light and NO gas is converted into $NO_2$, the amount of NO can be measured by detecting the generated light.

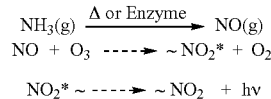

[Equation 1]

$$NH_3(g) \xrightarrow{\Delta \text{ or Enzyme}} NO(g)$$
$$NO + O_3 \dashrightarrow \sim NO_2^* + O_2$$
$$NO_2^* \sim \dashrightarrow \sim NO_2 + h\nu$$

FIGS. 1a to 1d are diagrams illustrating a conventional method for detecting an end-point of a CMP process.

Referring to FIG. 1a, a polysilicon layer 3, a conductive layer for gate electrode 5 and a hard mask nitride film 7 are sequentially formed on a semiconductor substrate 1 comprising a device isolation film (not shown).

A selective etching process is performed on the hard mask nitride film 7, the conductive layer for gate electrode 5 and the polysilicon layer 3 which are formed in FIG. 1a to form a gate line 8 having a sequentially stacked structure of a polysilicon pattern 3-1, a conductive pattern for gate electrode 5-1 and a hard mask nitride film pattern 7-1.

As shown in FIG. 1b, an oxide film (not shown) is formed on the whole surface of the resulting structure including the gate line 8.

As shown in FIG. 1c, an interlayer insulating film 13 is formed on the whole surface of the resulting structure including the gate line 8 and the nitride film spacer 10 which are formed in FIG. 1b.

As shown in FIG. 1d, the interlayer insulating film 13 of FIG. 1c is polished until the hard mask nitride film pattern 7-1 is exposed.

However, when the polishing process of FIG. 1d is performed, the hard mask nitride film which is a polishing barrier film starts to be exposed, and the amount of NO gas increase because the amount of $NH_3$ gas remarkably increases as shown in FIG. 1e.

As a result, time for setting an end-point by detecting the concentration of NO runs short. Therefore, since an end-point is set after a predetermined thickness of the hard mask nitride film is polished, the hard mask nitride film is deteriorated and a stable subsequent process cannot be performed.

SUMMARY OF THE INVENTION

Accordingly, it is an object of the present invention to provide a method for detecting an end-point of a CMP process of a semiconductor device by setting an end-point time so that a nitride film may be polished to a desired target without damage of the nitride film when all polishing processes are performed using the nitride film as a polishing barrier film, thereby improving reliability of a semiconductor device.

In an embodiment, there is provided a method for detecting an end-point of a CMP process of a semiconductor device wherein a buffer layer including nitrogen is formed on a gate line and a CMP process is performed, thereby preventing damage of a gate hard mask insulating film.

In an embodiment, the method for detecting an end-point of a CMP process of a semiconductor device comprises the steps of:

sequentially forming a polysilicon film, a conductive layer, a hard mask nitride film on a semiconductor substrate;

forming a buffer layer containing nitrogen on the hard mask nitride film;

selectively etching the buffer layer, the hard mask nitride film the conductive layer and the polysilicon film to form a gate line including a stacked structure of a polysilicon film pattern, a conductive layer pattern, a hard mask nitride film pattern and a buffer layer pattern;

forming a spacer at a sidewall of the gate line;

forming an interlayer insulating film on the semiconductor substrate including the gate line and the spacer; and subjecting the insulating film and the buffer layer to a CMP process using the hard mask nitride film pattern as an etching barrier film, wherein a concentration of NO gas generated in the CMP process is measured so as to set an end-point of the CMP process where a gradient of a tangent of concentration curve of the NO gas increases.

The buffer layer comprises a SiON or a Si-rich SiON film. A thickness of the buffer layer ranges from 200 to 1000 Å, preferably from 300 to 700 Å.

If a CMP process is performed on the insulating film after the buffer layer including nitrogen is formed on the hard mask nitride film, a concentration of NO gas generated is measured. The end point of the CMP process is a set where a gradient of a tangent of a concentration curve of the measured NO gas increased. That is, the end point is where the concentration curve of the NO gas is drastically increased such as inflection point. As a result, the end-point can be rapidly and precisely measured, thereby preventing damage of the nitride film and performing a stable subsequent process to improve reliability and productivity of a semiconductor device.

DETAILED DESCRIPTION OF THE PREFERRED EMBODIMENTS

The present invention will be described in detail with reference to the accompanying drawings.

Figure 1A:
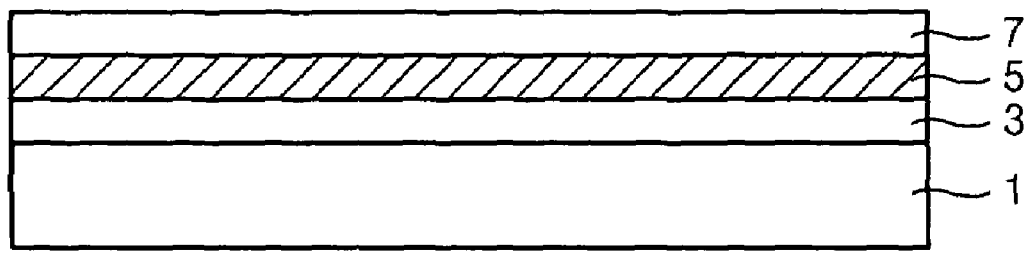
FIGS. 1a to 1d are diagrams illustrating a conventional method for detecting an end-point of a CMP process.
Figure 1B:
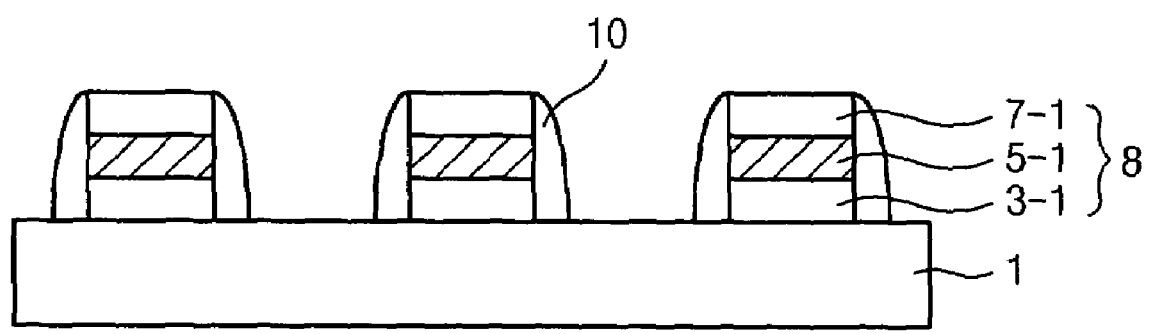
Figure 1C:
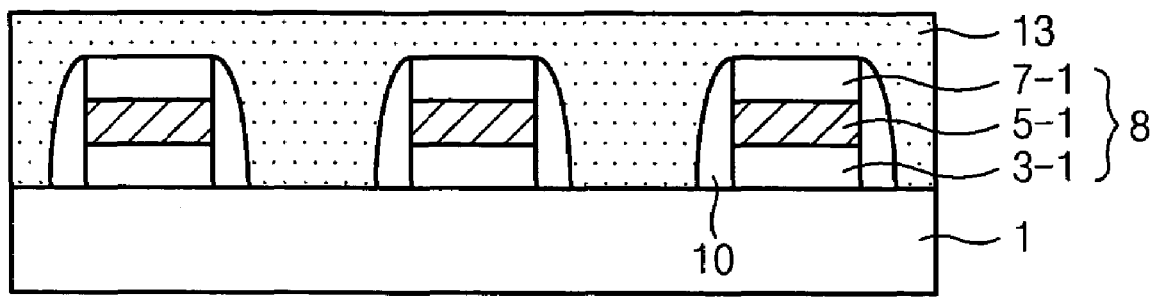
Figure 1D:
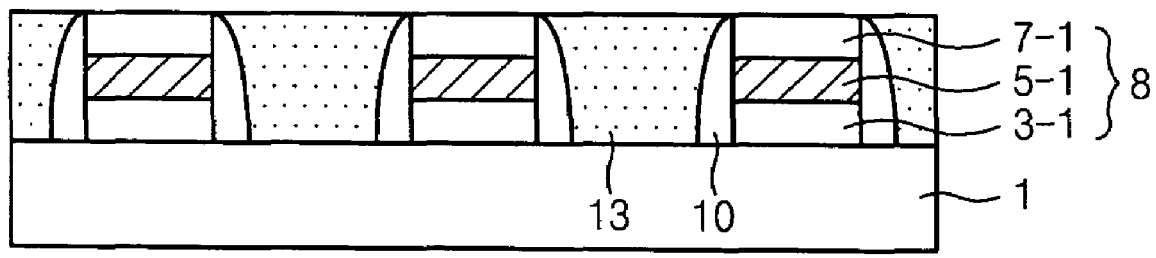
Figure 1E:
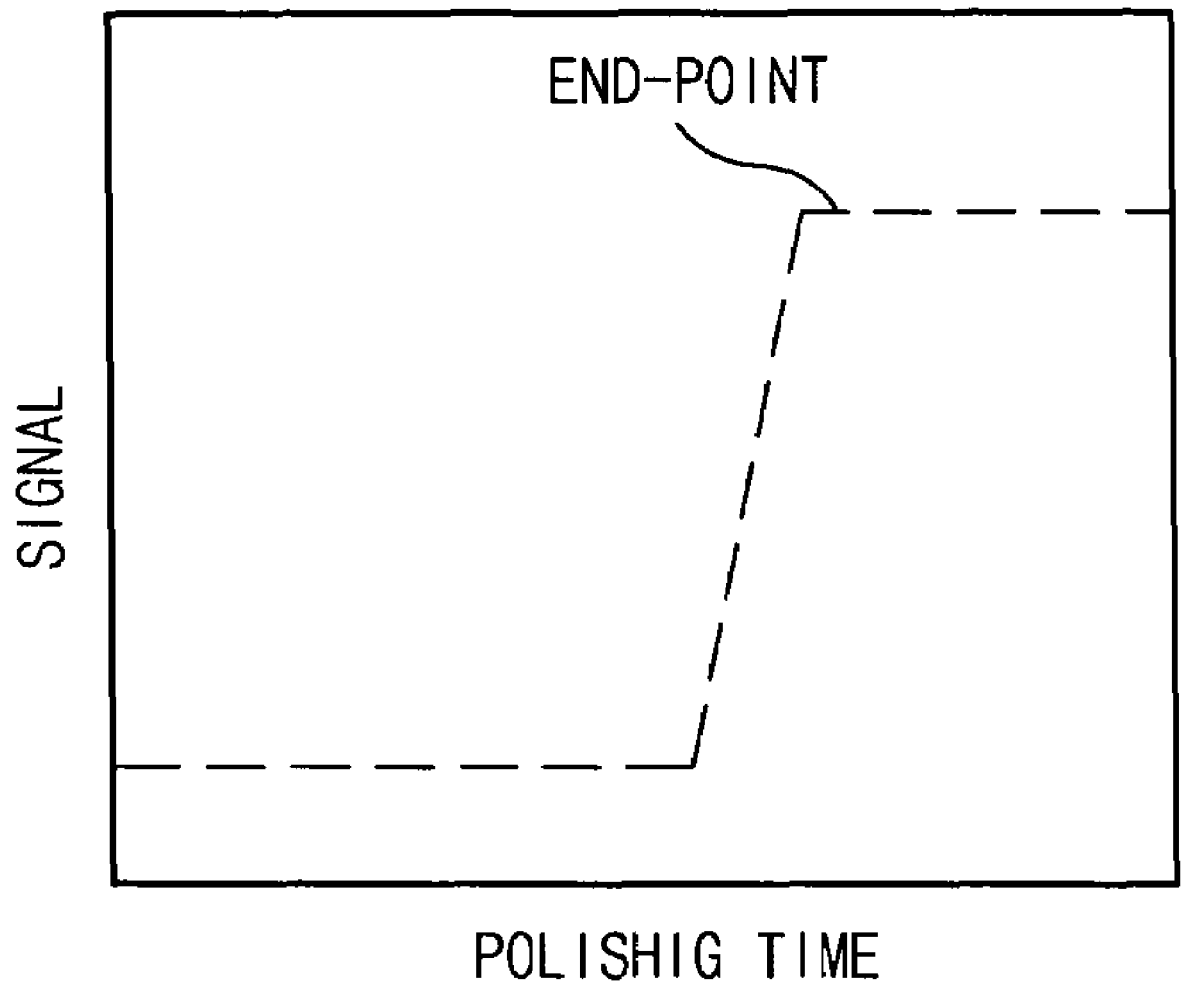
FIG. 1e is an end-point measurement graph depending on polishing time in the conventional method.
Figure 2A:
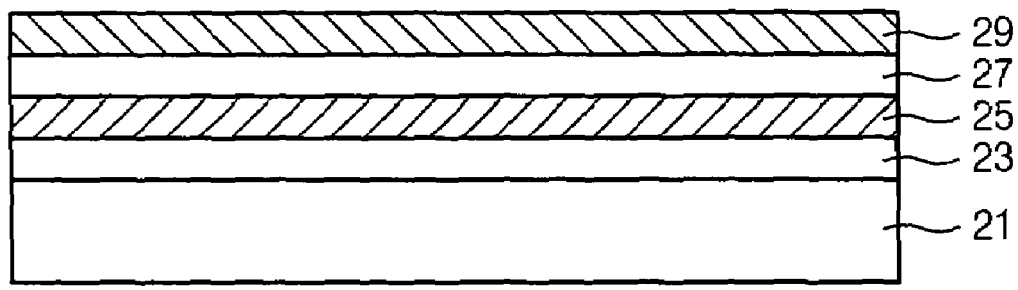
FIGS. 2a to 2d are diagrams illustrating a method for detecting an end-point of a CMP process according to an embodiment of the present invention.

Referring to FIG. 2a, a polysilicon layer 23, a conductive layer for gate electrode 25, a hard mask nitride film 27 and a buffer layer 29 are sequentially formed on a semiconductor substrate 21 including a device isolation film (not shown).

Preferably, the conductive layer for gate electrode is formed from a material selected from a group consisting of doped silicon, polysilicon, tungsten, tungsten nitride, tungsten silicide and titanium silicide.

The hard mask nitride film 27 preferably includes SiN film, and the buffer layer includes nitrogen, preferably a SiON film having a thickness ranging from 200 to 1000 Å.

A selective etching process is performed on the hard mask nitride film 27, the conductive layer for gate electrode 25 and the polysilicon layer 23 which are formed in FIG. 2a, thereby forming a gate line 28 having a sequentially stacked structure of a polysilicon pattern 23-1, a conductive pattern 25-1, a hard mask nitride film pattern 27-1 and a buffer layer pattern 29-1.

The selective etching process comprises a plasma etching process using a chlorine gas as a source such as $CCl_4$ or $Cl_2$ to have a high selectivity to a gate oxide film.

A oxide film spacer 30 is formed via LP CVD (low-pressure chemical vapor deposition) method using TEOS (Tetraethoxysilicate glass) film or silane ($SiH_4$)-base oxide film.

Figure 2B:
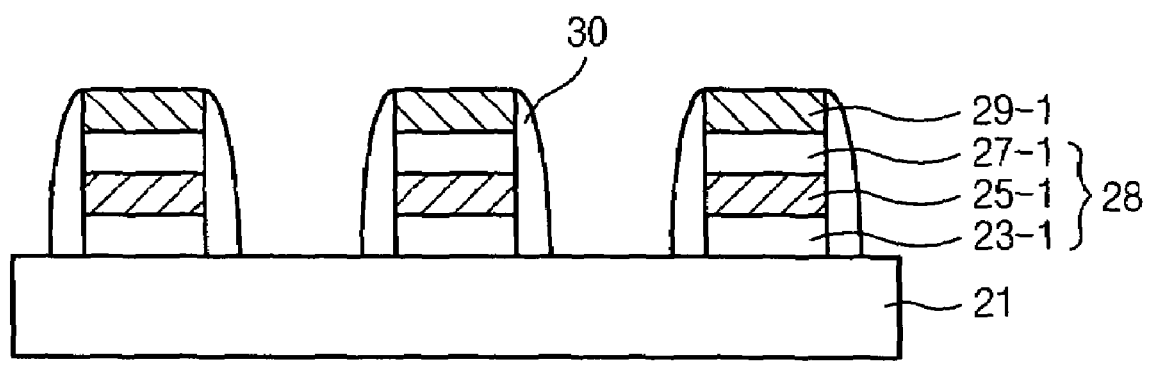
Figure 2C:
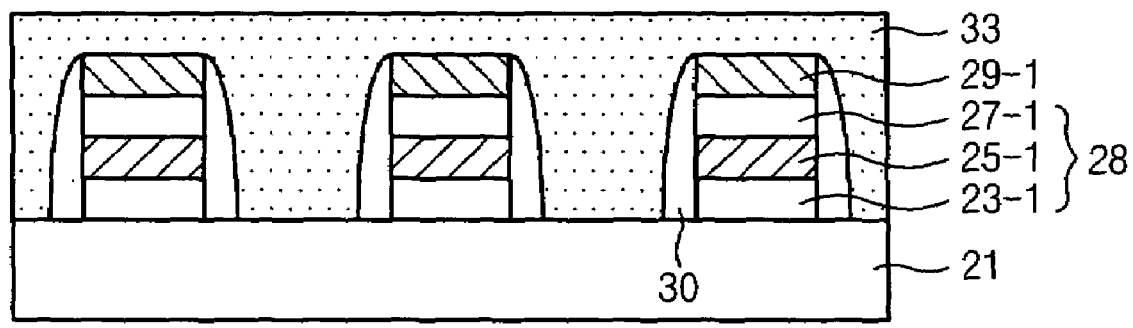

As shown in FIG. 2c, an interlayer insulating film 33 is formed on the whole surface of the resulting structure including the gate line 28 and the oxide film spacer 30 which are formed in FIG. 2b.

The interlayer insulating film is selected from a group consisting of doped oxide films having excellent filling characteristics such as a BPSG (boron phosphosilicate glass) film, a PSG (phosphosilicate glass) film, a FSG (fluorosilicate glass) film, a PE-TEOS (plasma enhanced tetraethoxysilicate glass) film or a PE-$SiH_4$ (plasma enhanced-silane) film; an APL (advanced planarization layer) oxide film or a ALD (atomic layer deposition) oxide film which are formed by a LP-CVD method using $H_2O_2$ and siren reaction source to have fluidity; high density plasma oxide films such as HDP USG (high density plasma undoped silicate glass) oxide film, HDP PSG (high density plasma phosphosilicate glass) oxide film; and mixtures thereof.

Preferably, the HDP oxide film is formed from a source selected from a group consisting of TEOS, $SiH_4$, $SiH(CH_3)_m$ ($0 \leq n \leq 4$, $0 \leq m \leq 4$), $N_2$, $N_2O$, $NH_3$, $O_2$, $O_3$, Ar, He and $NF_3$.

When an interlayer insulating film is formed using the HDP oxide film to thermal process performed in an atmosphere of a gas selected from a group consisting of $H_2$, $O_2$, $N_2$, $O_3$, $N_2O$ and $H_2+O_2$ at a temperature ranging form 500~1200° C. for more than 5 minutes. Otherwise, a rapid thermal processing (RTP) is performed at a temperature of more than 600° C., preferably ranging from 600 to 1500° C., for more than 5 seconds, thereby cohering the interlayer insulating films to improve density.

Figure 2D:
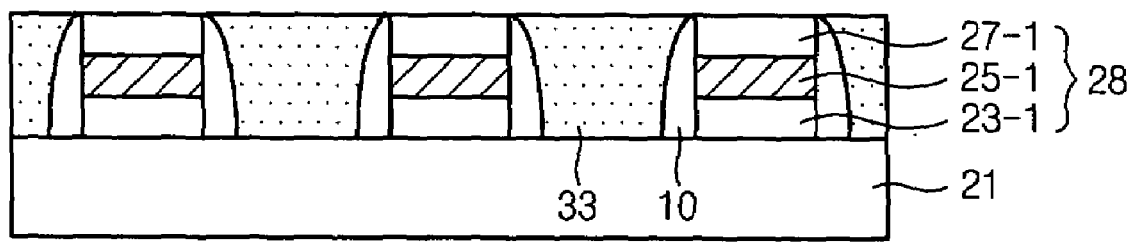

As shown in FIG. 2d, a CMP process is performed on the interlayer insulating film 33 until the hard mask nitride film pattern 27-1.

Figure 2E:
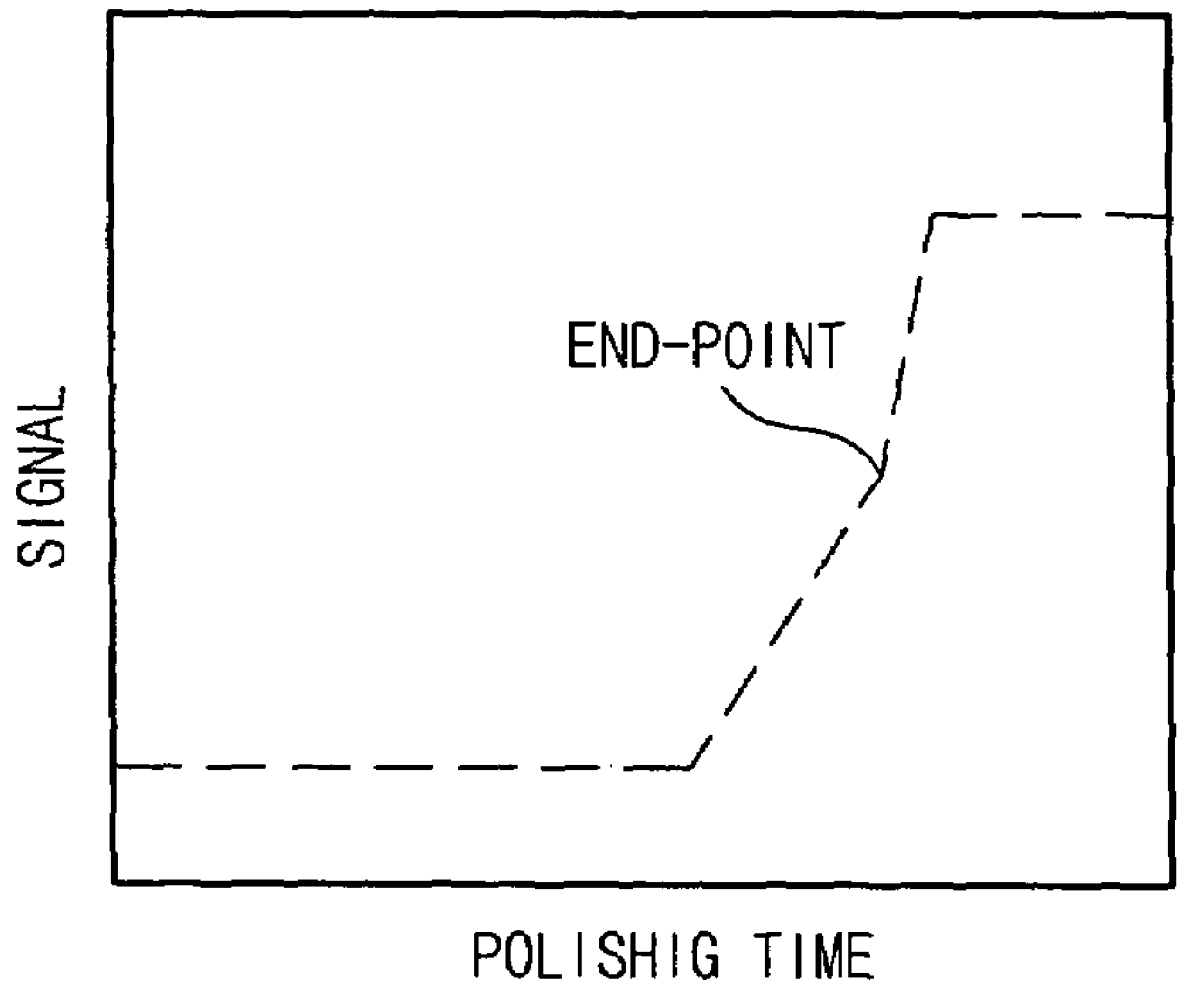
FIG. 2e is an end-point measurement graph depending on polishing time according to an embodiment of the present invention.

During the CMP process, a concentration of NO gas generated is measured. The end-point of the CMP process is set where a gradient of a tangent of a concentration curve of the measured NO gas is increased. That is, as shown in FIG. 2e, the end point is where the concentration curve of the NO gas is drastically increased such as inflection point.

In addition, the CMP process comprises:

polishing the interlayer insulating film using a first slurry until a remaining portion of the interlayer insulating film has at a thickness ranging from 300 to 800 Å; and polishing the remaining portion of interlayer insulating film and the buffer layer using a second slurry to expose the hard mask nitride film pattern.

The first slurry for oxide film contains 0.5~10 wt %, preferably from 1 to 10 wt %, of a abrasive selected from a group consisting of colloidal or fumed $SiO_2$, $Al_2O_3$, $CeO_2$ and $ZrO_2$ having a grain size ranging from 50 to 500 nm. The first slurry for oxide film comprises pH 2~12.

The first slurry for an oxide film has a polishing selectivity ratio of a oxide film to nitride film ranging from 1~10:1.

The second slurry as a high selective slurry for oxide film can use the same abrasive as the above-described abrasive of the first slurry. Preferably, $CeO_2$ is used for the abrasive of the second slurry which has a pH ranging from 3 to 8, preferably from 5 to 7. The second slurry has a polishing selectivity ratio of a oxide film to nitride film ranging from 10~150:1, preferably 15~100:1.

The CMP process is performed at a polishing pressure ranging from 1 to 10 psi and at a polishing table speed ranging from 10 to 100 rpm.

In the above-described CMP process, gradually increasing $NH_3$ gas is detected by the EPD from the SiON film which is the buffer layer as shown in FIG. 2e, and the $NH_3$ gas is measured from when the concentration of NO is represented to when the concentration of NO is drastically increased. As a result, since the end-point is rapidly and precisely set, the damage of upper portion of hard mask nitride film can be prevented, and measurement of films before and after the CMP process or confirmation of the CD can be skipped. Therefore, the process delay due to errors in setting polishing time can be previously prevented, and the whole process time can be shortened, thereby reducing fail of a semiconductor device and increasing yield.

As discussed earlier, in an embodiment of the present invention, since a CMP process is performed after a buffer layer including nitrogen is formed on a hard mask nitride film, a precise end-point can be detected. As a result, while an interlayer insulating film is polished, the damage of upper portion of hard mask nitride film can be prevented, and a stable subsequent process can be performed. Additionally, measurement of films before and after the CMP process or confirmation of the CD can be skipped, thereby reducing errors of a device due to process delay and increasing yield.

What is claimed is:

1. A method for detecting an end-point of a CMP process of a semiconductor device, comprising the steps of:
    sequentially forming a polysilicon film, a conductive layer, a hard mask nitride film on a semiconductor substrate;
    forming a buffer layer containing nitrogen on the hard mask nitride film;
    selectively etching the buffer layer, the hard mask nitride film, the conductive layer and the polysilicon film to form a gate line including a stacked structure of a polysilicon film pattern, a conductive layer pattern, a hard mask nitride film pattern and a buffer layer pattern;
    forming a spacer at a sidewall of the gate line;
    forming an interlayer insulating film on the semiconductor substrate including the gate line and the spacer; and
    subjecting the insulating film and the buffer layer of a CMP process using the hard mask nitride film pattern as an etching barrier film,
    wherein a concentration of NO gas generated upon exposure of the buffer layer in the CMP process is measured so as to detect an end-point of the CMP process.

2. The method according to claim 1, wherein the buffer layer comprises a SiON or a Si-rich SiON film.

3. The method according to claim 1, wherein a thickness of the buffer layer ranges from 200 to 1000 Å.

4. The method according to claim 1, wherein the conductive layer comprises a material selected from a group consisting of a doped silicon, polysilicon, tungsten, tungsten nitride, tungsten suicide and titanium suicide.

5. The method according to claim 1, wherein the selective etching process comprises a plasma etching process using a chlorine gas as a source.

6. The method according to claim 1, wherein the spacer is formed via a LP-CVD (low pressure chemical vapor deposition) method using TEOS (Tetraethoxysilicate glass) film or silane ($SiH_4$)-base oxide film.

7. The method according to claim 1, wherein the interlayer insulating film is selected from a group consisting of BPSG (boron phosphosilicate glass) film, a PSG (phosphosilicate glass) film, a FSG (fluorosilicate glass) film, a PE-TEOS (plasma enhanced tetraethoxysilicate glass) oxide film, a PE-$SiH_4$ (plasma enhanced-silane) film, a APL (advanced planarization layer) oxide film, a ALD (atomic layer deposition) oxide film and a HDP (high density plasma) oxide film.

8. The method according to claim 7, wherein the HDP oxide film is formed from a source selected from a group consisting of TEOS, $SiH_4$, $SiH_n(CH_3)_m$ ($0 \leq n \leq 4$, $0 \leq m \leq 4$), $N_2$ $N_2O$, $NH_3$, $O_2$, $O_3$, Ar, He and $NF_3$.

9. The method according to claim 7, further comprising subjecting the HDP oxide film to a thermal process performed in an atmosphere of a gas selected from a group consisting of $H_2$, $O_2$, $N_2$, $O_3$, $N_2O$ and $H_2^+O_2$.

10. The method according to claim 7, further comprising subjecting the HDP oxide film to a rapid thermal processing (RTP) performed at a temperature ranging from 600 to 1500° C.

11. The method according to claim 1, wherein the CMP process comprises:
    polishing the interlayer insulating film using a first slurry until a remaining portion of the interlayer insulating film has at a thickness ranging from 300 to 800 Å; and
    polishing the remaining portion of the interlayer insulating film and the buffer layer using a second slurry to expose the hard mask nitride film pattern.

12. The method according to claim 11, wherein the slurry for oxide film comprises 0.5.about. 10 wt % of an abrasive selected from a group consisting of colloidal or fumed $SiO_2$ having a grain size ranging from $_{50}$ to $_{500}$ nm, $Al_2O_3$, $CeO_2$ and $ZrO_2$.

13. The method according to claim 11, wherein the first slurry has a polishing selectivity ratio of an oxide film to nitride film ranging from 1:1.about. 10:1.

14. The method according to claim 11, wherein the second slurry comprises a slurry for oxide film having a pH ranging from 3 to 8 containing $CeO_2$ abrasive.

15. The method according to claim 11, wherein the second slurry has a polishing selectivity ratio of an oxide film to nitride film ranging from 10:1 to about 150:1.

16. The method according to claim 1, wherein the CMP process is performed at a polishing pressure ranging from 1 to 10 psi and at a polishing table speed ranging from 10 to 100 rpm.

* * * * *